Figure 1:
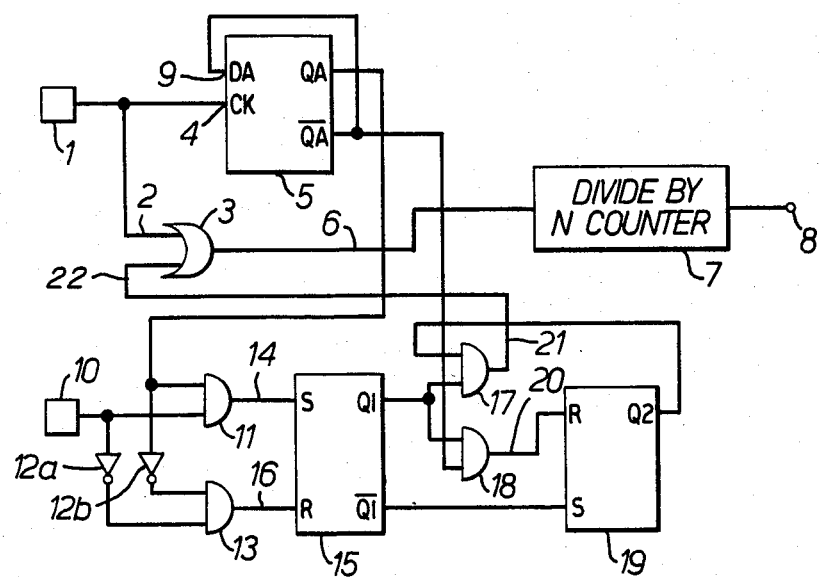

United States Patent [19]

Thompson et al.

[11] Patent Number: 4,495,630
[45] Date of Patent: Jan. 22, 1985

[54] ADJUSTABLE RATIO DIVIDER

[75] Inventors: Norman C. Thompson; Steven J. Poole, both of Wiltshire, England

[73] Assignee: Plessey Overseas Limited, Ilford, England

[21] Appl. No.: 328,248

[22] Filed: Dec. 7, 1981

[30] Foreign Application Priority Data

Dec. 8, 1980 [GB] United Kingdom ............... 8039315

[51] Int. Cl.³ .................. H03K 21/02; H03K 21/06; H03K 21/36
[52] U.S. Cl. ........................................ 377/110; 377/47
[58] Field of Search .................. 377/47, 48, 49, 110

[56] References Cited

U.S. PATENT DOCUMENTS 4,184,068  1/1980  Washburn ........................... 377/47

Primary Examiner—Stanley D. Miller
Assistant Examiner—K. Ohralik
Attorney, Agent, or Firm—Fleit, Jacobson, Cohn & Price

[57] ABSTRACT

The divider is formed by a dividing counter 7 to which an input pulse train is fed via an OR gate 3. The counter 7 has a fixed division ratio and the OR gate is controlled by a logic circuit which receives control pulses and controls the OR gate to remove one pulse from the input pulse train for each control pulse in order to change the overall division ratio of the divider. The invention is particularly suitable as an adjustable ratio divider for use in frequency synthesizers.

6 Claims, 2 Drawing Figures

ADJUSTABLE RATIO DIVIDER

This invention relates to an adjustable modulus divider.

A well known form of adjustable modulus divider is a two modulus divider, which finds application in frequency synthesisers, and which includes a dividing counter which has a control signal input to change the division ratio of the counter.

A control signal applied to the control signal input of the counter reconfigures the counter so that it divides by a second division ratio i.e.: N+1 rather than: N.

A problem with this known type of divider is the time delay between the application of a control signal and the response of the divider. This time delay is known as the 'set-up' or 'release' time in dependence upon the direction in which the division ratio is being changed. The problem is more severe in the case of lower division ratio divider.

This invention seeks to provide an adjustable modulus divider in which the above mentioned problem is mitigated.

According to this invention there is provided an adjustable ratio divider comprising a dividing counter having a fixed division ratio and which is clocked by an input pulse train fed to the counter via a gate associated with a logic circuit, which logic circuit comprises dividing means arranged to frequency divide the input pulse train to provide a divided pulse train and a complementary divided pulse train, synchronising means arranged to generate a first control output and a complementary first control output, each of which is synchronised with the divided pulse train, in dependence on a control signal fed to the synchronising means and the divided pulse train, means for generating a second control output in response to the complementary first control output in dependence on the first control output and the complementary divided pulse train, and gate control means responsive to the first control output and the second control output to provide a gating signal to control the gate to remove one or more pulses from the input train so that the division ratio of the divider is effectively variable in dependence on the number of control pulses received by the logic circuit during an output cycle of the dividing counter.

The gate control means may comprise an AND gate which receives the first control output and the second control output to provide the gating signal in dependence thereon.

The synchronising means may comprise a first AND gate having a first input and a second input, the divided pulse train being fed to the first input and the control signal being fed to the second input to provide a first output in dependence on the control signal and the divided pulse train, which first output is fed to a set input of a set-reset flip-flop which sets the flip-flop to produce the first control output, a second AND gate having a first input and a second input, the divided pulse train being fed to the first input via a first inverter and the control signal being fed to the second input via a second inverter to produce a second output in dependence on the control signal and the divided pulse train, which second output is fed to a reset input of the set-reset flip-flop which resets the flip-flop to produce the complementary first output.

The means for generating the second control output may comprise another set-reset flip-flop having a set input which receives the complementary first control output which sets the other flip-flop to produce the second control signal, an AND gate having a first input and a second input, the first control output being fed to the first input and the complementary pulse train being fed to the second input to produce an output which is fed to a reset input of the other flip-flop which resets the other flip-flop in dependence on the first control output and the complementary pulse train.

The dividing means may comprise a D-type bistable, the divided pulse train and the complementary divided pulse train each having a frequency of a half of the input pulse train.

Figure 2:
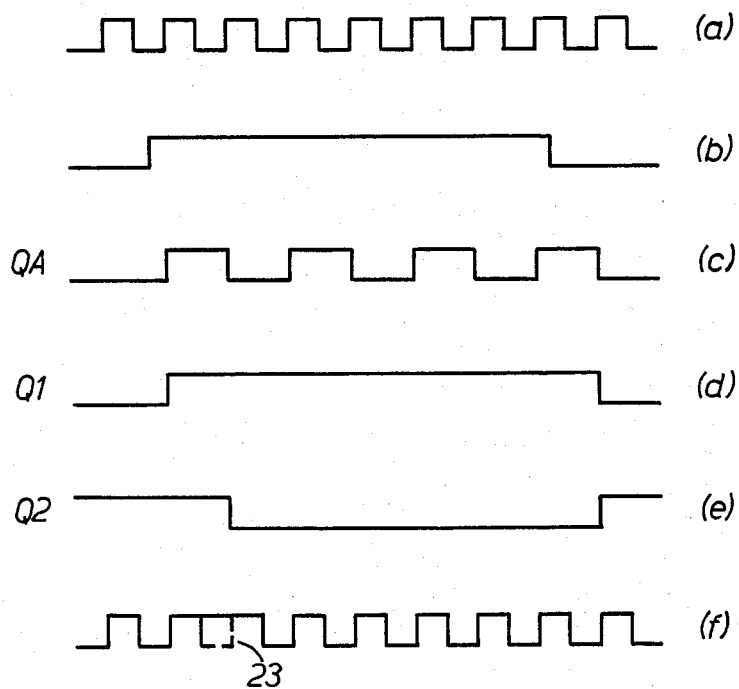

An exemplary embodiment of the invention will now be described with reference to the accompanying drawings in which:

FIG. 1 shows an adjustable ratio divider in accordance with the present invention and FIG. 2 is an explanatory diagram showing wave forms appearing at various points in the arrangement of FIG. 1.

Referring to FIG. 1 input signals to be divided are fed to an input terminal 1 which is connected to one input 2 of an OR gate 3. The input signals are also fed to a logic circuit associated with the OR gate 3, which logic circuit has a dividing means consisting of a D-type bistable 5, a synchronising means which consists of a pair of AND gates 11 and 13, a pair of inverters 12a and 12b, and a set-reset flip-flop 15, a means for generating a second control output $Q_2$ consisting of an AND gate 18 and a second set-reset flip-flop 19, and a gate control means consisting of an AND gate 17. The input singals are received by a clock input 4 of the D-type bistable 5. Output signals from the OR gate 3 are fed over a line 6 to clock a dividing counter 7 which has a fixed division ratio N. The counter 7 feeds divided output signals to an output terminal 8 which is the output of the adjustable ratio divider.

The bistable 5 has a D input 9 and complementary outputs $Q_A$ and $\overline{Q}_A$. The $\overline{Q}_A$ output is connected back to the D input 9 of the bistable so that the bistable 5 acts in known manner as a frequency divider to provide a divided pulse train at the $Q_A$ terminal, and a complementary divided pulse train at the $\overline{Q}_A$ output terminal, each being one half of the frequency of the signals fed to the input terminal 1.

A control signal input terminal 10 is provided to which a control signal is fed in operation to change the division ratio of the divider. The terminal 10 is connected to one input of the AND gate 11 and via the inverter 12a to an input of the second AND gate 13. The $Q_A$ output of the bistable 5 is connected to a second input of the AND gate 11 and via the inverter 12b to a second input of the AND gate 13.

The AND gate 11 provides a first output 14 which is fed to a set ('S') input of a set-reset flip-flop 15, whilst the AND gate 13 provides a second output 16 which is coupled to the reset (R) input of the flip-flop 15.

The flip-flop 15 provides a first control output $Q_1$ and a complementary control output $\overline{Q}_1$, the $Q_1$ output being fed to the AND gate 17, and the AND gate 18 of the means for generating the second control output $Q_2$. The $\overline{Q}_1$ output is connected to the S input of the second set-reset flip-flop 19.

The AND gate 18 has an output 20 connected to the R input of the flip-flop 19 which has a Q output referenced $Q_2$ connected to a second input of the AND gate 17. The AND gate 18 has its second input connected to the $\overline{Q}_A$ output of the D-type bistable 5, and the AND gate 17 provides a gating signal 21 which is connected to a second input 22 of the OR gate 3.

Referring now to FIGS. 1 and 2 together, an input pulse train shown at line (a) in FIG. 2 is fed to the input terminal 1 and then to the input 2 of the OR gate 3. In the absence of a logically high signal at the second input terminal 22 of the gate 3 the pulse train will be fed through the gate 3 over the line 6 and will be divided by the counter 7. The counter 7 divides the pulse train by a factor N and this divided pulse train will appear at the output terminal 8. The divider therefore has a division ratio N between the input and output terminals 1 and 8 respectively.

The input pulse train is also fed to the clock input 4 of the D-type bistable 5 and in view of the connection between the $\overline{Q}_A$ output of this bistable and its D input 9, a pulse train will appear at the $Q_A$ output of one half the frequency of that fed to the input terminal 1. This pulse train is indicated at line (c) in FIG. 2.

Assume now that control pulses of lower frequency than the input pulse train are fed to the control input terminal 10, one such pulse being indicated at line (b) in FIG. 2. This control pulse is fed directly to the AND gate 11 and in inverted form to the gate 13 and has no effect on either gate until such time as the $Q_A$ output of the bistable 5 goes high. At this point the output 14 of the AND gate 11 will go logically high and will put the flip-flop 15 into the set state in which the $Q_1$ output is logically high.

The AND gate 13 receives the same inputs as the AND gate 11 but in inverted form and consequently when the control pulse goes logically low and following this the $Q_A$ output of the bistable 5 also goes low the AND gate 13 will have an output 16 which is logically high and which will reset the flip-flop 15 so that its $Q_1$ output goes logically low whilst its $\overline{Q}_1$ output is logically high.

The $Q_1$ output of the set-reset flip-flop 15 will therefore for each control pulse produce a pulse shown at line (d) of FIG. 2 whose overall length is governed by the length of the control pulse but whose leading and trailing edges are synchronised to leading and trailing edges of the pulse train appearing at the $Q_A$ output of the bistable.

As explained above the $Q_1$ output of the flip flop 15 first goes high in synchronism with the $Q_A$ output of the bistable 5. The $Q_1$ output of the flip flop 15 is connected to one input of the AND gate 18 but at this stage has no effect on that gate since the second input of the gate 18 is connected to the $\overline{Q}_A$ output of the bistable 5 which is logically low when the $Q_A$ output is high.

As can be seen from lines (a) and (c) of FIG. 2 the $Q_A$ output of the bistable 5 will go logically low after one complete clock cycle of the input pulse train. The $Q_1$ output of the flip-flop 15 will still be high at this stage and therefore the output 20 of the AND gate 18 will go logically high and this will reset the flip flop 19 so that the Q output $Q_2$ of that flip flop will go logically low.

The waveform appearing at the $Q_2$ output of the flip flop 19 is shown at line (e) of FIG. 2. As can be seen from lines (d) and (e) of FIG. 2, at the time immediately proceeding that at which the $Q_1$ output of the flip-flop 15 goes high the $\overline{Q}_1$ output will be high since this output is the complement of the $Q_1$ output. When $\overline{Q}_1$ is logically high this will set the flip-flop 19 so that its $Q_2$ output will be logically high.

The state of $Q_2$ will not be affected when $Q_1$ goes high and $\overline{Q}_1$ goes low since as explained above the logically high level of $Q_1$ does not affect the AND gate 18 at the time at which $Q_1$ goes logically high. The AND gate 18 is not enabled so as to reset the flip-flop 19 until one clock cycle later of the input signal fed to the input terminal 1.

Consequentially the $Q_1$ and $Q_2$ outputs of the flip-flops 15 and 19 are logically high together for one clock cycle of the input signal. The output 21 of the AND gate 17 will therefore be logically high for this one clock cycle since both $Q_1$ and $Q_2$ are fed to respective inputs of that AND gate.

The output 21 of the gate 17 is connected to the input 22 of the OR gate 3 and this input will therefore be held at a logically high level for one clock cycle of the input signal.

The effect of holding the input 22 of the OR gate 3 logically high for one clock cycle of the input signal is to mask out one clock edge of this signal which clock edge would otherwise be fed over line 6 to clock the counter 7. As a result of this the signal appearing at the output terminal 8 will be divided by N+1 rather than by N although the counter 7 itself continues to divide by N.

In order therefore to produce a division ratio of N+1 for the whole divider, one control pulse must be fed to the control input terminal 10 during each output cycle of the counter 7, so as to remove one clock edge from the pulse train fed to the counter 7 during each output cycle of that counter.

If two clock pulses are applied to the control input terminal 10 during each output cycle of the counter 7, then two clock edges will be removed from the input signal and the output signal appearing at the terminal 8 will be divided by N+2, and so on.

The present invention therefore mitigates the time delay encountered in the above described prior art arrangement since there is no reconfiguration of the counter 7. This counter continues to divide by N, the division ratio being controlled by removing clock edges which would otherwise have clocked this counter.

The invention is particularly suitable for use in frequency synthisisers where two modulus or other forms of adjustable ratio divider are required.

What we claim is:

1. An adjustable ratio divider comprising a dividing counter having a fixed division ratio and which is clocked by an input pulse train fed to the counter via a gate associated with a logic circuit, which logic circuit comprises dividing means arranged to frequency divide the input pulse train to provide a divided pulse train and a complementary divided pulse train, synchronising means arranged to generate a first control output and a complementary first control output, each of which is synchronised with the divided pulse train, in dependence on a control signal fed to the synchronising means and the divided pulse train, means for generating a second control output in response to the complementary first control output in dependence on the first control output and the complementary divided pulse train, and gate control means responsive to the first control output and the second control output to provide a gating signal to control the gate to remove one or more pulses from the input pulse train so that the division ratio of the divider is effectively variable in dependence on the number of control pulses received by the logic circuit during an output cycle of the dividing counter.

2. An adjustable ratio divider according to claim 1 wherein the gate control means comprises an AND gate which receives the first control output and the second control output to provide the gating signal in dependence thereon.

3. An adjustable ratio divider according to claim 2 wherein the synchronising means comprises a first AND gate having a first input and a second input, the divided pulse train being fed to the first input and the control signal being fed to the second input to provide a first output in dependence on the control signal and the divided pulse train, a set-reset flip-flop having a set input and an output, said first output being fed to said set input of a said set-reset flip-flop which sets the flip-flop to produce the first control output, a first inverter and a second inverter, a second AND gate having a first input and a second input, the divided pulse train being fed to the first input of said second AND gate via said first inverter and the control signal being fed to the second input via said second inverter to produce a second output in dependence on the control signal and the divided pulse train, which second output is fed to a reset input of the set-reset flip-flop which resets the flip-flop to produce the complementary first output.

4. An adjustable ratio divider according to claim 3 wherein the means for generating the second control output comprises another set-reset flip-flop having a set input which receives the complementary first control output which sets the other flip-flop to produce the second control signal, a third AND gate having a first input and a second input, the first control output being fed to the first input of said third AND gate and the complementary pulse train being fed to the second input of said third AND gate to produce an output which is fed to a reset input of the other flip-flop which resets the other flip-flop in dependence on the first control output and the complementary pulse train.

5. An adjustable ratio divider according to claim 4 wherein the dividing means is a D-type bistable and the divided pulse train and the complementary divided pulse train each have a frequency of a half of the input pulse train.

6. An adjustable ratio divider according to claim 1 wherein the dividing means is a D-type bistable and the divided pulse train and the complementary divided pulse train each have a frequency of a half of the input pulse train, the synchronising means comprises a first AND gate having a first input and a second input, the divided pulse train being fed to the first input and the control signal being fed to the second input to provide a first output in dependence on the control signal and the divided pulse train, which first output is fed to a set input of a set-reset flip-flop which sets the flip-flop to produce the first control output, a second AND gate having a first input and a second input, a first and a second inverter, the divided pulse train being fed to the first input of said second AND gate via said first inverter and the control signal being fed to the second input of said second AND gate via said second inverter to produce a second output in dependence on the control signal and the divided pulse train, which second output is fed to a reset input of the set-reset flip-flop which resets the flip-flop to produce the complementary first output, the means for generating the second control output comprises another set-reset flip-flop having a set input which receives the complementary first control output which sets the other flip-flop to produce the second control signal, a third AND gate having a first input and a second input, the first control output being fed to the first input of said third AND gate and the complementary pulse train being fed to the second input of said third AND gate to produce an output which is fed to a reset input of the other flip-flop which resets the other flip-flop in dependence on the first control output and the complementary pulse train, and the gate control means comprises an AND gate which receives the first control output and the second control output to provide the gating signal in dependence thereon.

* * * * *